United States Patent [19]
Eda et al.

[11] Patent Number: 5,453,652
[45] Date of Patent: Sep. 26, 1995

[54] SURFACE ACOUSTIC WAVE DEVICE WITH INTERDIGITAL TRANSDUCERS FORMED ON A HOLDING SUBSTRATE THEREOF AND A METHOD OF PRODUCING THE SAME

[75] Inventors: Kazuo Eda, Nara; Yutaka Taguchi; Keiji Onishi, both of Settsu; Shun-ichi Seki, Osaka, all of Japan

[73] Assignee: Matsushita Electric Industrial Co., Ltd., Osaka, Japan

[21] Appl. No.: 168,658

[22] Filed: Dec. 16, 1993

[30] Foreign Application Priority Data

Dec. 17, 1992 [JP] Japan ................. 4-336505

[51] Int. Cl.⁶ ................. H01L 41/08; H03H 9/25
[52] U.S. Cl. ................. 310/313 R; 310/344
[58] Field of Search ............... 310/313 B, 313 R, 310/340, 344

[56] References Cited

U.S. PATENT DOCUMENTS

| | | | |
|---|---|---|---|
| 3,665,225 | 5/1972 | van den Heuvel et al. | 310/313 R |
| 3,786,373 | 1/1974 | Schulz et al. | 310/313 R |
| 3,952,268 | 4/1976 | Schulz et al. | 310/313 R |
| 4,270,105 | 5/1981 | Parker et al. | 310/313 A |
| 4,516,049 | 5/1985 | Mikoshiba et al. | 310/313 A |
| 4,737,742 | 4/1988 | Takoshima et al. | 310/313 R |
| 4,795,934 | 1/1989 | Rogerson et al. | 310/313 R |
| 4,864,470 | 9/1989 | Nishio | 361/400 |
| 4,993,000 | 2/1991 | Niitsuma et al. | 310/313 R |
| 5,095,240 | 3/1992 | Nysen et al. | 310/313 R |

FOREIGN PATENT DOCUMENTS

| | | | |
|---|---|---|---|
| 0098154 | 1/1984 | European Pat. Off. | H03H/9/64 |
| 3138743 | 7/1983 | Germany | 310/344 |
| 0139513 | 8/1983 | Japan | 310/313 R |
| 1-177707 | 7/1989 | Japan . | |
| 3-6912 | 1/1991 | Japan . | |
| 3006912 | 1/1991 | Japan | 310/313 B |
| 4-283957 | 10/1992 | Japan . | |
| 67320 | 6/1973 | Luxembourg | H03H/9/145 |
| 1382542 | 2/1975 | United Kingdom | H03H/9/00 |

OTHER PUBLICATIONS

EPO Search Report (EP 93 12 0420) dated Apr. 12, 1994.

*Primary Examiner*—Thomas M. Dougherty
*Attorney, Agent, or Firm*—Ratner & Prestia

[57] ABSTRACT

A surface acoustic wave device includes: a holding substrate; a piezoelectric substrate; an interdigital transducer formed on the holding substrate; and supports for holding said piezoelectric substrate on the holding substrate so that the interdigital transducer is evenly in contact with the piezoelectric substrate.

16 Claims, 10 Drawing Sheets

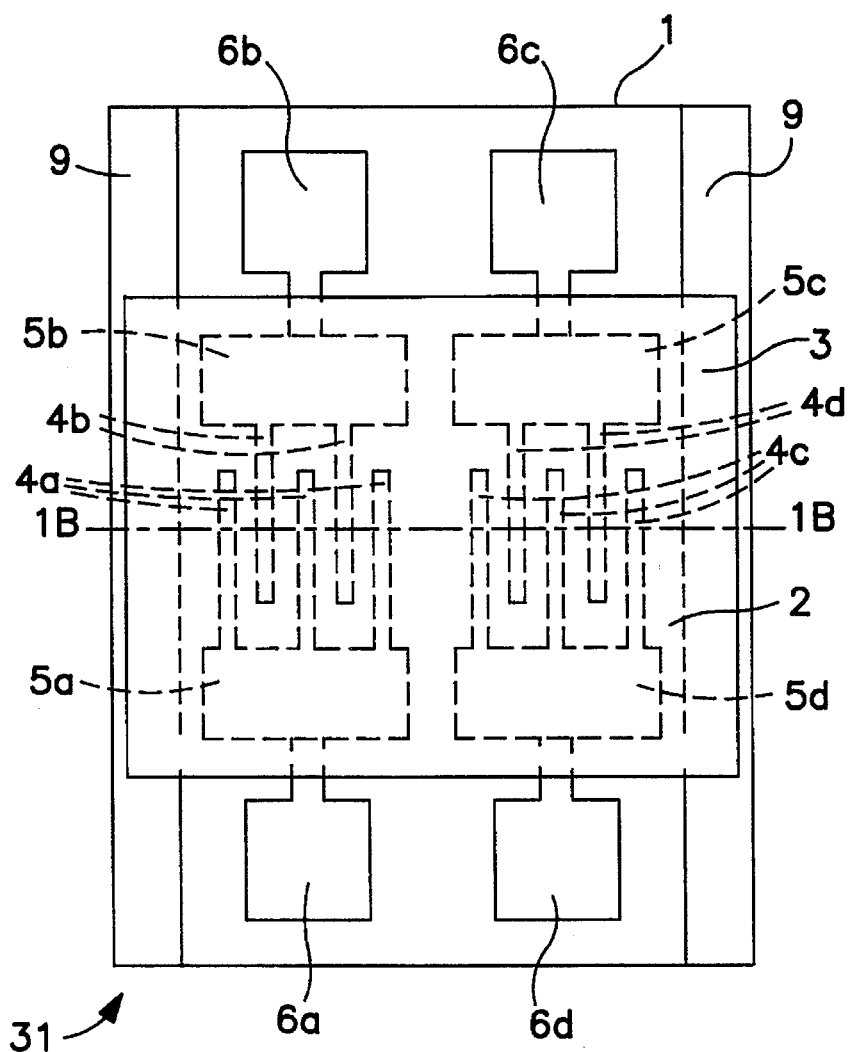
FIG. IA
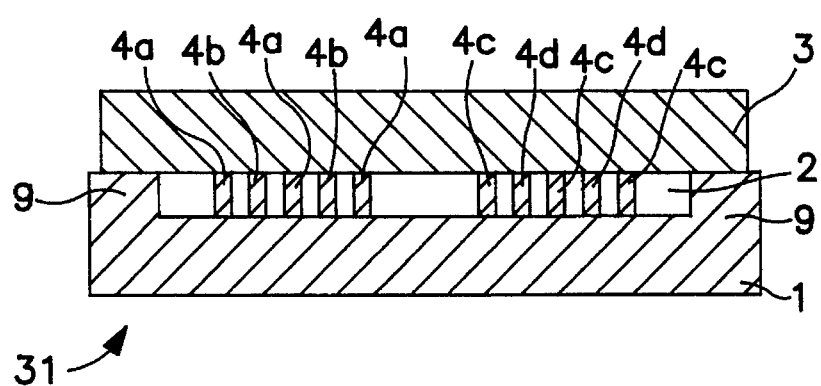
FIG. IB 5,453,652

SURFACE ACOUSTIC WAVE DEVICE WITH INTERDIGITAL TRANSDUCERS FORMED ON A HOLDING SUBSTRATE THEREOF AND A METHOD OF PRODUCING THE SAME

BACKGROUND OF THE INVENTION

1. Field of the Invention

The present invention relates to a surface acoustic wave device, especially to a surface acoustic wave device used as high-frequency filters or resonators and to a method of producing the same.

2. Description of the Related Art

Advancements in mobile communication technologies in recent years have been causing communication equipment to become much more compact and operate at higher frequencies. Such equipment requires oscillators and high-frequency filters as indispensable components which often comprise surface acoustic wave devices.

Conventional surface acoustic wave devices, such as surface acoustic wave filters and surface acoustic wave resonators, are made by forming interdigital transducers on a piezoelectric substrate such as lithium niobate or lithium tantalate, whereon the surface acoustic wave is generated by applying an alternate electric field to the interdigital transducers. A surface acoustic wave device used in the mobile communication equipment must have good operation characteristics in the high frequency range. High-frequency characteristics of a surface acoustic wave is evaluated as a frequency pass-band and an insertion loss in the case of a filter, and a resonation Q value which corresponds to the inverse of loss in the case of a resonator. The frequency pass-band is determined by the electromechanical coupling factor and the temperature dependence thereof of the piezoelectric material to be used, which generally have values characteristic of the piezoelectric material used. Thus the possible magnitude of the frequency pass-band is roughly determined by what piezoelectric material is used. In the case of lithium niobate having a relatively high electromechanical coupling factor and low dependence on the temperature, for example, the electromechanical coupling factor is about 5 to 10% and the temperature dependence is 70 to 100 ppm/°C. Temperature dependence is desired to be as low as possible.

The vibration frequency of a surface acoustic wave device is inversely proportional to the interval and width of the interdigital transducers. In order to make a filter or a resonator having a vibration frequency of 1 GHz, for example, the width and interval of the strip line of the interdigital transducers should be about 1 µm when lithium niobate or lithium tantalate is used. Because the mass of the electrode has an adverse effect on the oscillation characteristics of the surface acoustic wave, it is required to reduce the electrode mass as the dimension of the interdigital transducer decreases. In actual applications, a light metal such as aluminum is used with the thickness being set to within 0.1 µm in order to fabricate the interdigital transducer. As a result, resistive loss due to the electric resistance of the interdigital transducers increases as the frequency increases. Consequently, increase in the frequency leads to an increase in the insertion loss in the case of filter, and to a decrease of Q value in the case of resonator.

When a surface acoustic wave device is used in a radio transmitter section, power capacity becomes a critical problem. In the case of mobile telephone, power capacity of about 0.2 watts is sufficient in the receiver section, though the transmitter section requires a power capacity of about 2 watts at the front end thereof. Because the interdigital transducers of a surface acoustic wave device are fastened directly on the oscillating section of the surface acoustic wave, the electrodes are constantly exposed to mechanical vibration and therefore may be physically destroyed (breakage due to stress migration) when they are subject to vibration having a large magnitude of power. When the interdigital transducers are made in small dimensions for operation at higher frequencies, in particular, it easily fails due to line breakage or other causes. Thus it has not been able to obtain a surface acoustic wave device having high power capacity.

There also have been problems in the aspects of manufacture and application, in that the smaller distance between interdigital transducers makes insulation failure between interdigital transducers easier to occur due to the pyroelectric effect.

As described above, conventional surface acoustic wave devices have such problems as increasing insertion loss, decreasing Q value of resonance, inability to obtain high power capacity and susceptibility to pyroelectric breakage, as the interdigital transducer is made in smaller dimensions for the operation at higher frequencies.

One known constitution of surface acoustic wave device of the prior art is that proposed in the Japanese Patent Publication No. 3-6912 wherein interdigital transducers, being arranged above a piezoelectric substrate with an air gap secured in-between, are supported by an insulator bridge made of a non-piezoelectric material. More specifically, the surface of the piezoelectric substrate is covered with a polysilicon film 50 to 150 nm thick whereon interdigital transducers made of Au 2 µm thick is formed, with a $SiO_2$ insulator film 5 µm thick covering thereon, then an opening for the polysilicon is made through which the polysilicon is selectively removed by etching and interdigital transducers are made to oppose the piezoelectric substrate via an air gap of 50 to 150 nm. Because the interdigital transducers are placed via an air gap, the mass of the interdigital transducers does not affect the oscillating section of the surface acoustic wave. Thus it is made possible to reduce both the spurious and the insertion loss.

In the constitution disclosed in the above patent, however, because the insulating support holding the interdigital transducers is a thin film formed by vacuum evaporation or other means, its mechanical strength is not sufficient and therefore does not have sufficient mechanical reliability against vibration required for such applications as mobile communication equipment. Specifically, there are serious practical problems such as breakage of the electrode in vibration test or drop test and change in the air gap causing the electromechanical coupling characteristic, thereby leading to a deterioration of the performance. Because the insulating support must be made of a material which can be formed by the thin film technology, applicable materials are limited and it is difficult to obtain a suitable material having appropriate thermal expansion coefficient. No consideration is given to the temperature dependence. The above construction has another problem of greater device size because it requires to be housed in a package for hermetic seal.

The present invention overcomes aforementioned shortcomings associated with conventional surface acoustic wave devices and provides a compact surface acoustic wave device capable of providing good high-frequency characteristics for filter and resonator, in particular low loss, high Q value of resonance, high power capacity, good temperature characteristic, high mechanical reliability and good pyroelectric resistance even at high frequencies.

SUMMARY OF THE INVENTION

The surface acoustic wave device of this invention, includes: a holding substrate; a piezoelectric substrate; an interdigital transducer formed on the holding substrate; and means for holding the piezoelectric substrate on the holding substrate such that the interdigital transducer is evenly in contact with the piezoelectric substrate.

In one embodiment of the invention, the holding substrate has a recess and protrusions formed by the recess, and the interdigital transducer is formed on a recessed position of the holding substrate, and the holding means includes the protrusions of the holding substrate.

In another embodiment of the invention, the piezoelectric substrate has a recess and protrusions formed by the recess, and the interdigital transducer is in contact with a recessed position of the piezoelectric substrate, and the holding means includes the protrusions of the piezoelectric substrate.

In still another embodiment of the invention, the holding means includes at least one spacer.

In still another embodiment of the invention, the thermal expansion coefficients of the holding substrate is smaller than the thermal expansion coefficient of the piezoelectric substrate.

In still another embodiment of the invention, the piezoelectric substrate is made of a material selected from the group consisting of lithium niobate, lithium tantalate, lithium borate and quartz.

In still another embodiment on the invention, the holding substrate is made of one of glass and silicon.

In still another embodiment of the invention, the holding substrate and the piezoelectric substrate are bonded with each other by direct bonding.

In still another embodiment on the invention, an air gap formed by the holding substrate and the piezoelectric substrate is sealed by a hermetic sealing adhesive, thereby hermetically sealing at least the interdigital transducer.

According to another aspect of the present invention, a surface acoustic wave device is provided. The surface acoustic wave device includes: a holding substrate; a piezoelectric substrate; an interdigital transducer formed on the substrate; and supports, bonded with one of the holding substrate and the piezoelectric substrate by direct bonding, for holding the piezoelectric substrate above the interdigital transducer with an air gap interposed therebetween.

In one embodiment of the invention, the holding substrate has a recess and protrusions formed by the recess, and the interdigital transducer is formed on a recessed position of the holding substrate, and the holding means includes the protrusions of the holding substrate.

In another embodiment of the invention, the piezoelectric substrate has a recess and protrusions formed by the recess, and the holding means includes the protrusions of the piezoelectric substrate.

In still another embodiment of the invention, the holding means includes at least one spacer.

In still anther embodiment of the invention, the thermal expansion coefficients of the holding substrate is smaller than the thermal expansion coefficient of the piezoelectric substrate.

In still another embodiment of the invention, the piezoelectric substrate is made of a material selected from the group consisting of lithium niobate, lithium tantalate, lithium borate and quartz.

In still another embodiment of the invention, the holding substrate is made of one of glass and silicon.

In still anther embodiment of the invention, wherein an air gap formed by the holding substrate and the piezoelectric substrate is sealed by a hermetic sealing adhesive thereby hermetically sealing the interdigital transducer.

According to still another aspect of the present invention, a method for producing a surface acoustic wave device is provided. The method includes the steps of: forming a interdigital transducer on a holding substrate; subjecting at least both bonding surfaces of the holding substrate and a piezoelectric substrate to a hydrophilic treatment; attaching at least both bonding surfaces to each other so that the interdigital transducer is placed sufficiently near the piezoelectric substrate so as to excite surface acoustic wave on the piezoelectric substrate; and heating at least both bonding surfaces.

Thus, the invention described herein makes possible the following advantages:

(1) Because the interdigital transducers are formed on a interdigital transducer holding substrate which is separate from the piezoelectric substrate, the surface acoustic wave is not affected by the electrode mass and therefore the electrodes can be made thick by using any metallic material to reduce the electric resistance sufficiently to decrease the loss.

(2) Temperature characteristic of the surface acoustic wave device can be improved by selecting the appropriate combination of the thermal expansion coefficients of the interdigital transducer holding substrate and the piezoelectric substrate. The allowable range of materials to be selected for the substrate is broad.

(3) Because the interdigital transducers are not directly mounted on the surface acoustic wave oscillating section or is mounted with a space provided to keep the surface acoustic wave oscillating section and the interdigital transducers from making contact with each other, deterioration due to stress migration is improved and the power capacity is greatly improved.

(4) Making substantially hermetic sealing structure with the interdigital transducer holding substrate enables it to make it compact while maintaining the reliability with regard to weatherability.

(5) By using a material free of pyroelectricity for the interdigital transducer holding substrate, strength against insulation breakdown between the interdigital transducers due to pyroelectricity can be increased.

(6) When the interdigital transducers are mounted close to the piezoelectric substrate, the electromechanical coupling factor becomes greater and constant than in the case of providing a space between the interdigital transducer and the piezoelectric substrate surface, and therefore stable characteristics can be obtained in the aspect of manufacture.

(7) Because the substrate having the interdigital transducers is bonded to the piezoelectric substrate by means of heat treatment after making the joining surfaces hydrophilic and laminating them, very high mechanical reliability can be obtained.

(8) Because a thick holding substrate having sufficient mechanical strength can be used, high strength against mechanical shock such as dropping can be obtained.

These and other advantages of the present invention will become apparent to those skilled in the art upon reading and understanding the following detailed description with reference to the accompanying figures.

BRIEF DESCRIPTION OF THE DRAWINGS

FIG. 1A is a schematic plan view of surface acoustic wave device according to Example 1 of the invention.

FIG. 1B is a schematic cross-sectional view of surface acoustic wave device according to Example 1 of the invention.

DESCRIPTION OF THE PREFERRED EMBODIMENTS

Example 1

Figure 2A:
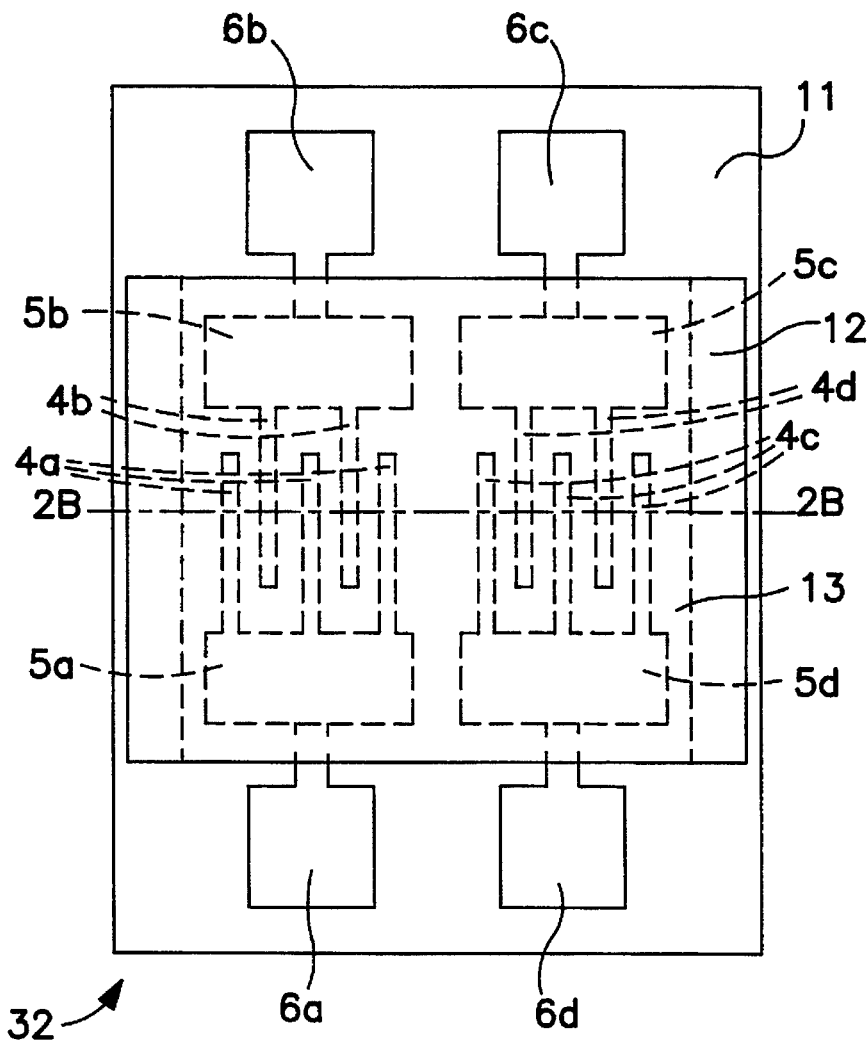
FIG. 2A is a schematic plan view of surface acoustic wave device according to Example 2 of the invention.

Hereinafter, a surface acoustic wave device of the invention according to Example 1 is now described. FIG. 1A is a schematic plan view of a surface acoustic wave device 31, and FIG. 1B is a schematic cross-sectional view taken along a line a—a' in FIG. 1A. The surface acoustic wave device 31 has a holding substrate 1 and interdigital transducers 4a, 4b, 4c, and 4d. The holding substrate 1 has a recess 2 and protrusions 9 formed by the recess 2 and is made of glass, silicon, etc. The interdigital transducer 4a, 4b, 4c, and 4d are formed on the holding substrate 1 such that the interdigital transducers 4a and 4c interdigitate with the interdigital transducers 4b and 4d, respectively. The interdigital transducers 4a, 4b, 4c, and 4d are respectively connected with electrode pads 5a, 5b, 5c, and 5d and with terminals 6a, 6b, 6c, and 6d.

The surface acoustic wave device 31 further has a piezoelectric substrate 3 on the protrusions 9, which functions as supports for holding the piezoelectric substrate 3 on the holding substrate 1 so that the interdigital transducers 4a, 4b, 4c, and 4d are evenly in contact with the piezoelectric substrate 3. The piezoelectric substrate 3 has a plane shape and is made of piezoelectric material such as lithium niobate, lithium tantalate, lithium borate, or quartz. The piezoelectric substrate 3 is bonded with the holding substrate 1 by direct bonding which is explained hereinafter, and is held on the holding substrate 1. Depth of the recess 2 and thickness of the interdigital transducers 4a, 4b, 4c, and 4d are set so that the interdigital transducers 4a, 4b, 4c, and 4d can be evenly in contact with the piezoelectric substrate 3.

Application of alternate electric fields to the interdigital transducers 4a and 4b through the terminals 6a and 6b excites surface acoustic wave on the surface of the piezoelectric substrate 3. The excited surface acoustic wave propagates on the piezoelectric substrate 3 to reach the surface of the piezoelectric substrate which is in contact with the interdigital transducers 4c and 4d. Then, the excited surface acoustic wave is transformed into electric signals again. Therefore, the surface acoustic wave device 31 of the invention has a function similar to that of the surface acoustic wave device which has interdigital transducers formed on the piezoelectric substrate. Moreover, the surface acoustic wave device 31 can have less insertion loss, higher power capacity and less temperature dependence at high frequencies than that of the conventional surface acoustic wave device.

Hereinafter, a method for producing the surface acoustic wave device 31 is now explained. A glass substrate having a thickness of 450 μm is used as a holding substrate 1. The holding substrate 1 has a recess 2 which is 1 μm deep. A piezoelectric substrate 3 is made of lithium niobate which is 64-degree Y-cut and X-propagation, and has a thickness of 450 μm. After forming a resist pattern (not shown in FIGS. 1A and 1B) on a recessed portion of the holding substrate 1, a chromium film having a thickness of about 0.01 μm and a gold film having a thickness of about 1.0 to 1.1 μm are successively formed on the resist pattern and the recessed portion by evaporation. Then, interdigital transducers 4a, 4b, 4c, and 4d, electrode pads 5a, 5b, 5c, and 5d, and terminals 6a, 6b, 6c, and 6d are formed by a lift-off method.

The holding substrate 1 and the piezoelectric substrate 3 are placed in the predetermined position and are pressed onto one another to form direct bonding therewith. Being a little thicker than the depth of the recess 2, the interdigital transducers 4a, 4b, 4c, and 4d and the electrode pads 5a, 5b, 5c, and 5d are compressed by the pressure and are evenly in contact with the piezoelectric substrate 3.

Direct bonding process is carried out after carefully cleaning the bonding surfaces of the piezoelectric substrate 3 and the holding substrate 1, treating the bonding surfaces with ammonia-hydrogen peroxide solution to make the bonding surfaces hydrophilic, then cleaning them with pure water, by placing them on each other and heating them while applying pressure with a weight placed on the bonding face or by other means. This bonding is caused by hydrogen bonding of hydrogen, oxygen and hydroxyl group which are the constituents of water adsorbed onto the surfaces or by covalent bonding which is caused by dehydration from the interface due to the heat treatment so that stronger bonding can be obtained.

Figure 10A:
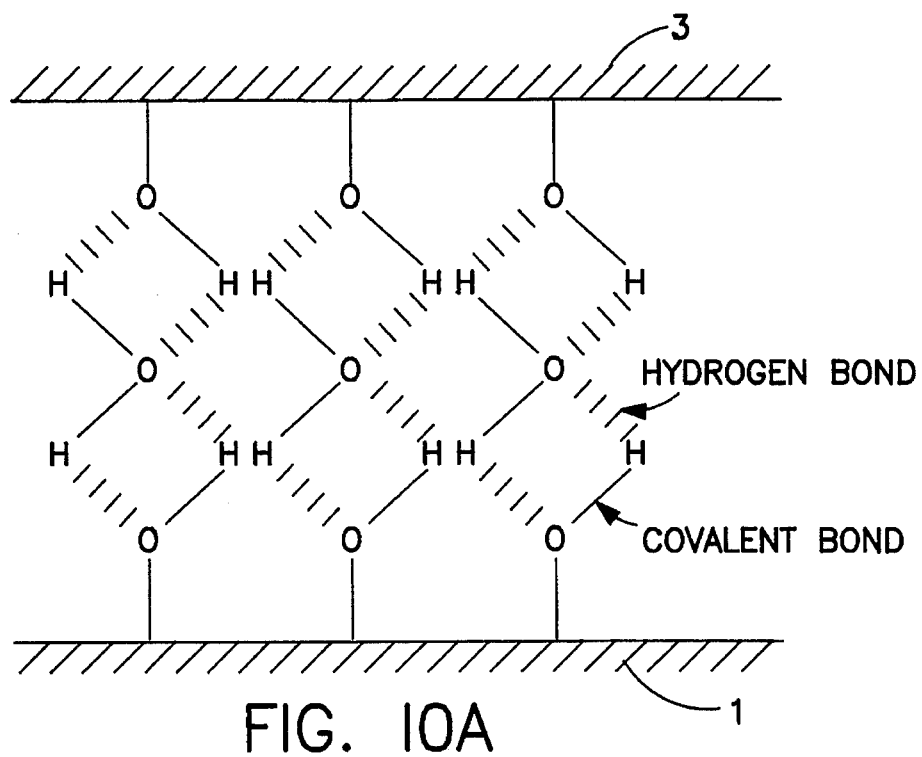
FIGS. 10A through 10C illustrate a direct bonding used in the invention.
Figure 10B:
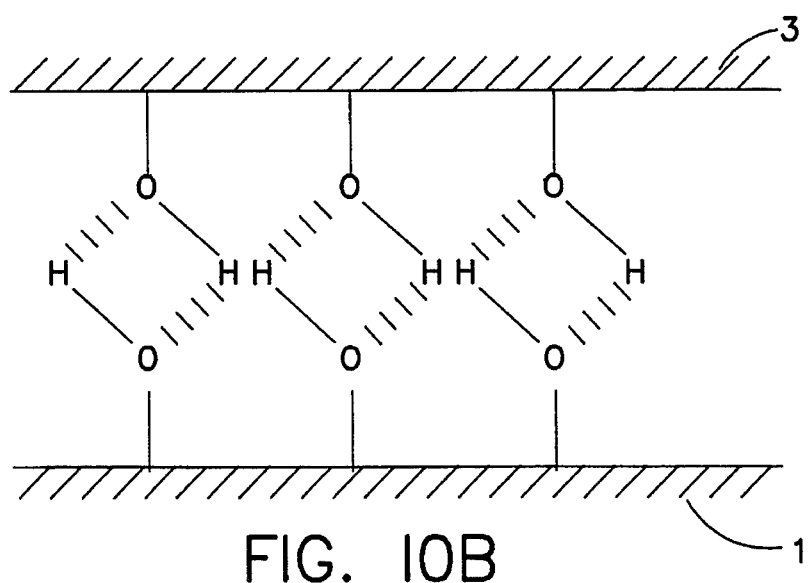
Figure 10C:
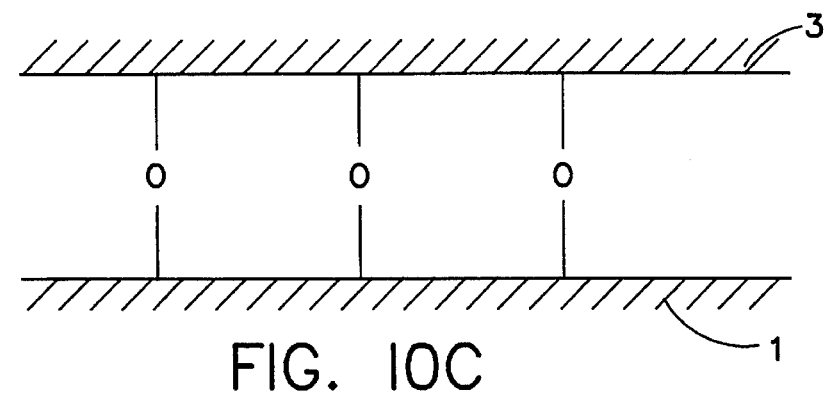

As is shown in FIG. 10A, after the surfaces of the holding substrate 1 and the piezoelectric substrate 3 are sufficiently cleaned, subjected to a hydrophilic treatment, and immersed in pure water, a number of hydroxyl groups are formed on the surfaces of the holding substrate 1 and the piezoelectric substrate 3. When the holding substrate 1 and the piezoelectric substrate 3 are attached to each other under this condition, they are firmly bonded through direct bonding by the hydrogen bond formed among the hydroxyl groups. Water molecules adsorbed onto the surface hydroxyl groups may bridge this bonding. As is shown in FIG. 10B, heat treatment of the bonded substrates promotes gradual dehydration from the interface between the holding substrate 1 and the piezoelectric substrate 3. As the heating temperature rises, the dehydration is further promoted, and the holding substrate 1 and the piezoelectric substrate 3 are bonded through covalent bonding with oxygen atoms interposed therebetween or with oxygen atoms at the surface thereof. The strength of the direct bonding depends on materials of the holding substrate 1 and the piezoelectric substrate 3, and the hydrogen bonding and the covalent bonding may coexist as is shown in FIGS. 10A to 10C.

Silicon included in the glass substrate or in the silicon substrate is liable to covalent bonding to make the bonding easy to occur. Because no adhesive such as resin is used in the interface, the bonding is called direct bonding. In direct bonding, deviation from parallelism in the interface is in the order of the atom which results in very good parallelism, and therefore the interdigital transducers can be pressure-bonded onto the piezoelectric substrate with excellent uniformity which cannot be obtained by other bonding methods.

Heat treatment takes effect at temperatures 100° C. and above, and therefore can be carried out at temperatures below that which causes changes in the materials constituting the substrate. In case the holding substrate 1 is made of glass, heat treatment can be applied at a temperature below the softening point of glass, and there are various glass substrates which can be heat-treated at temperatures as low as 500° C. The bonding obtained in such a process is bonding at the level of atom, providing an extremely strong bonding of very high surface accuracy so having excellent hermetic sealing performance can be obtained.

Comparison between a filter operating in the 1.5 GHz band made by setting the width and interval of the strip lines of the interdigital transducers to about 0.7 μm and arranging a plurality of input and output interdigital transducers alternately adjacent to each other, to form a so-called surface acoustic wave filter having an interdigitated interdigital transducer (IIDT) structure, and a sample with interdigital transducers being formed on the surface of a piezoelectric substrate in the conventional constitution without employing the arrangement of holding the interdigital transducers as in this example, shows improvements in various characteristics.

First, there are improvements in the insertion loss and the power capacity. In the surface acoustic wave device of the conventional constitution, even when aluminum is used for the interdigital transducer to alleviate the adverse effect of the mass added to the surface acoustic wave oscillating section, it cannot be avoided making them in a thickness of about 0.06 μm, resulting in a large insertion loss due to the resistive loss of the interdigital transducer. In this example, in contrast, insertion loss can be made about 1.0 to 1.5 dB less than the conventional device because Au of about 1 μm thick is used. As for the power capacity, too, while the surface acoustic wave device of the prior art is durable only to about 0.2 W of power due to the stress migration, because the interdigital transducers are fastened on the piezoelectric substrate which violently oscillates, the constitution of this example easily achieves a power capacity of over 1 W because the interdigital transducers are in contact with the piezoelectric substrate oscillating section but are not directly fastened onto the oscillating section and therefore the power capacity is improved. Power capacity is evaluated through the change in the central frequency when a specified level of power of high-frequency in the pass-band range is transmitted. The constitution as described above greatly improves the high-frequency loss and power capacity.

Because the bonding of the holding substrate 1 and the piezoelectric substrate 3 is strong enough for various vibration tests and drop test, breakage of the electrode structure or change in the electrical characteristics is not found. Also because the holding substrate 1 can be made thick enough than in the case of thin film, it has far greater mechanical strength than in the case of holding thin film.

Temperature dependence is also improved. Temperature dependence of a surface acoustic wave device is measured in terms of the change in the resonance frequency with temperature. Temperature dependence of lithium niobate is −70 ppm/°C. in the case of 64-degree Y-cut X-axis propagation type. Temperature dependence of the resonance frequency of the surface acoustic wave is determined by both the temperature dependence of the sound speed and the elogation of interval of the interdigital transducers due to the thermal expansion of the substrate. Therefore, if the thermal expansion coefficient of the a substrate carrying the interdigital transducers thereon is less than the thermal expansion coefficient of the piezoelectric substrate, the interval of the interdigital transducers is determined by the thermal expansion coefficient of the holding substrate 1, and consequently has an effect of reducing the temperature dependence.

The thermal expansion coefficient of lithium niobate has anisotropy with respect to the crystal orientation, and changes in a range of 7.5 to 15.4 ppm/°C. By using a material having a thermal expansion coefficient smaller than these values as the holding substrate 1, temperature dependence can be reduced. When a glass substrate having a thermal expansion coefficient of 4 ppm/°C. is used and a lithium niobate substrate having a crystal orientation wherein the thermal expansion coefficient is 15.4 ppm/°C. is used for the piezoelectric substrate 3, temperature dependence can be greatly improved without significantly changing the electromechanical coupling factor.

The thermal expansion coefficient of lithium tantalate in the major crystal orientation is 16 ppm/°C., thermal expansion coefficient of quartz in the major crystal orientation is 13.7 ppm/°C., thermal expansion coefficient of lithium borate in the major crystal orientation is 13 ppm/°C., thermal expansion coefficient of glass varies in a range from 3 to 15 ppm/°C., and thermal expansion coefficient of silicon is in a range from 3 to 4 ppm/°C. Thus use of glass or silicon for the holding substrate material enables various combinations of materials, while using a material having a thermal expansion coefficient less than that of the piezoelectric substrate for the holding substrate.

Piezoelectric substrate materials such as lithium niobate have high pyroelectric property in that electric charges appear on the substrate surface when the temperature changes. As a result, there has been a problem in that, when forming interdigital transducers with line intervals as small as 0.7 μm by photolithography or dry etching process, heating of the substrate easily causes insulation breakdown. This problem is solved in this example, because materials having no pyroelectric property such as glass or silicon can be used for the holding substrate whereon the interdigital transducers are formed.

A interdigital transducer structure similar to that of this example with lithium tantalate, lithium borate or quartz used for the piezoelectric substrate 3 and glass or silicon used for the holding substrate 1 has substantially similar effects in terms of insertion loss and power capacity, in comparison to the conventional structure wherein interdigital transducers are formed on the piezoelectric substrate. Improvement in the temperature dependence similar to that described above can also be obtained by setting the thermal expansion coefficient of the holding substrate 1 lower than that of the piezoelectric substrate 3. Similar effects can also be obtained in terms of the mechanical reliability and pyroelectricity resistance. Bonding can be done by processing the surface to make it hydrophilic and applying heat treatment to the substrates placed on each other, in any combination of the materials for the piezoelectric substrate 3 and the holding substrate 1.

When a silicon substrate is used as a holding substrate 1, it should preferably have high electric resistance because the resistance is accompanied by the loss. Specifically, a silicon substrate has a sheet resistance of about 1000 ohm per square. When a silicon substrate having low electric resistance is used as a holding substrate 1, the silicon substrate preferably has a silicon oxide film or silicon nitride film thereon, or the silicon substrate is preferably oxidized near the surface thereof.

Example 2

Figure 2B:
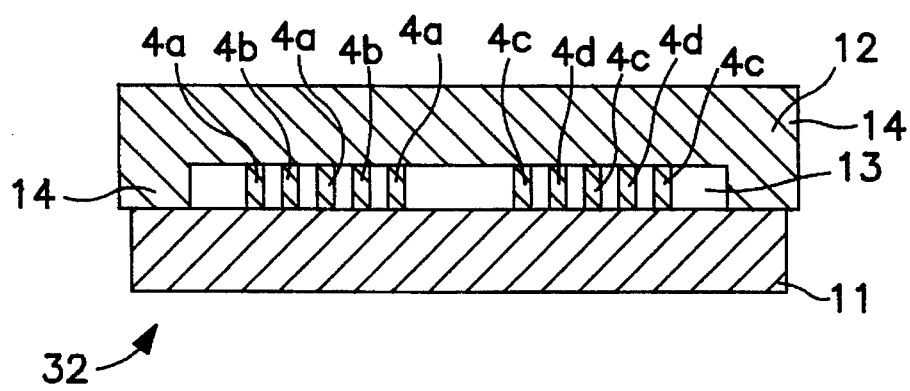
FIG. 2B is a schematic cross-sectional view of surface acoustic wave device according to Example 2 of the invention.

Hereinafter, a surface acoustic wave device of the invention according to Example 2 is now described. FIG. 2A is a schematic plan view of a surface acoustic wave device 32, and FIG. 2B is a schematic cross-sectional view taken along a line b-b' in FIG. 2A. The surface acoustic wave device 32 has a holding substrate 11 and interdigital transducers 4a, 4b, 4c, and 4d. The holding substrate 11 has a plane shape and is made of glass, silicon, etc. The interdigital transducers 4a, 4b, 4c, and 4d are formed on the holding substrate 11 such that the interdigital transducers 4a and 4c interdigitate with the interdigital transducers 4b and 4d, respectively. The interdigital transducer 4a, 4b, 4c, and 4d are respectively connected with electrode pads 5a, 5b, 5c, and 5d and with terminals 6a, 6b, 6c, and 6d.

The surface acoustic wave device 32 further has a piezoelectric substrate 12. The piezoelectric substrate 12 has a recess 13 and protrusions 14 formed by the recess 13. The protrusions 14 functions as supports for holding the piezoelectric substrate 12 on the holding substrate 11 so that the interdigital transducers 4a, 4b, 4c, and 4d are evenly in contact with the piezoelectric substrate 12. The piezoelectric substrate 12 is made of piezoelectric material such as lithium niobate, lithium tantalate, lithium borate or quartz. The piezoelectric substrate 12 is bonded with the holding substrate 11 by direct bonding which is explained in the example and is held on the holding substrate 11.

The surface acoustic wave device 32 has functions and effects similar to those of the surface acoustic wave device 31 of the Example 1. The surface acoustic wave device 32 is produced by a method similar to the method explained in the Example 1. A glass substrate having a thickness of 450 μm is used as the holding substrate 11. The piezoelectric substrate 12 is made of lithium niobate which is 64-degree Y-cut and X-propagation, and has a thickness of 450 μm. The piezoelectric substrate 12 also has a recess 13 which is 1 μm deep. The interdigital transducers 4a, 4b, 4c, and 4d, the electrode pads 5a, 5b, 5c, and 5d, and the terminals 6a, 6b, 6c, and 6d are formed of the bilayer film of a chromium film having a thickness of about 0.01 μm and a gold film having a thickness of about 1.0 to 1.1 μm, so that the interdigital transducers 4a, 4b, 4c, and 4d are evenly in contact with the piezoelectric substrate 12. Method of bonding is also similar to that of the surface acoustic wave device 31 of the Example 1. As is mentioned in the Example 1, the thermal expansion coefficient of the holding substrate 11 is set to be lower than that of the piezoelectric substrate 12, and the width and interval of the strip lines of the interdigital transducers 4a, 4b, 4c, and 4d are set to about 0.7 μm with a plurality of input and output interdigital transducers being arranged alternately adjacent to each other, thereby to form a so-called surface acoustic wave filter having an interdigitated interdigital transducer (IIDT) structure and operating in 1.5 GHz band. Such a constitution has effects similar to the surface acoustic wave device 31 of the Example 1 with respect to the temperature dependence, insertion loss, power capacity, mechanical reliability and pyroelectricity resistance.

Example 3

Figure 3A:
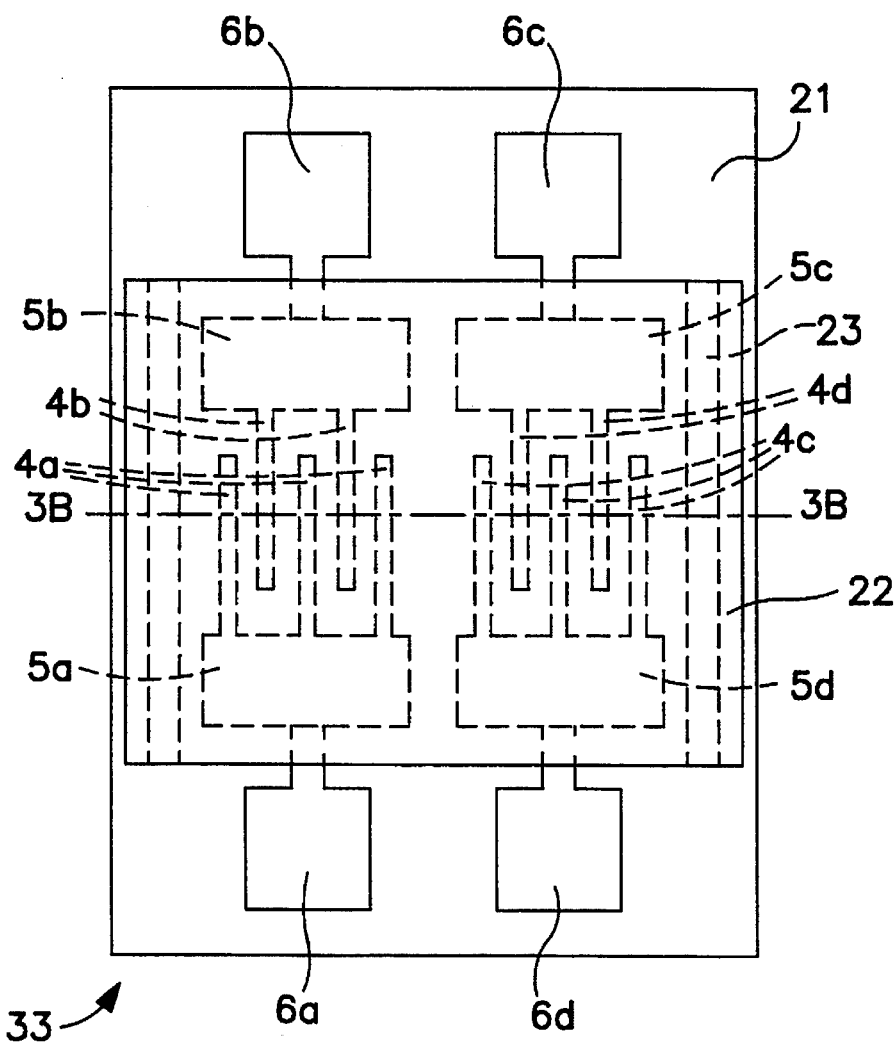
FIG. 3A is a schematic plan view of surface acoustic wave device according to Example 3 of the invention.
Figure 3B:
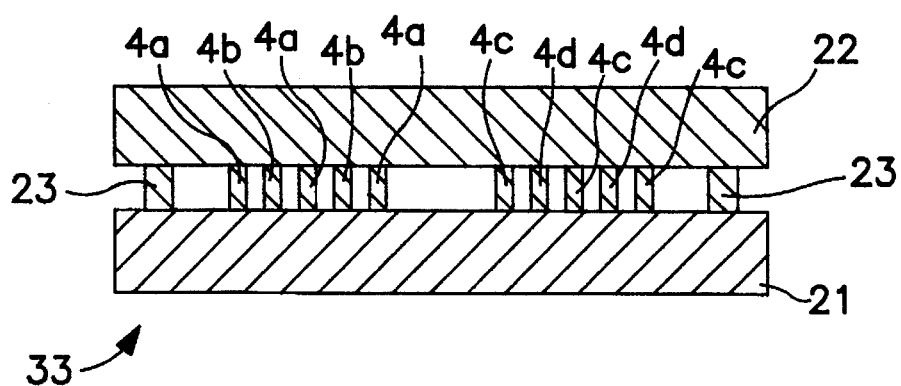
FIG. 3B is a schematic cross-sectional view of surface acoustic wave device according to Example 3 of the invention.

Hereinafter, a surface acoustic wave device of the invention according to Example 3 is now described. FIG. 3A is a schematic plan view of a surface acoustic wave device 33, and FIG. 3B is a schematic cross-sectional view taken along a line c-c' in FIG. 3A. The surface acoustic wave device 33 has a holding substrate 21 and interdigital transducers 4a, 4b, 4c, and 4d. The holding substrate 21 has a plane shape and is made of glass, silicon, etc. The interdigital transducers 4a, 4b, 4c, and 4d are formed on the holding substrate 21 such that the interdigital transducers 4a and 4c interdigitate with the interdigital transducers 4b and 4d, respectively. The interdigital transducers 4a, 4b, 4c, and 4d are respectively connected with electrode pads 5a, 5b, 5c, and 5d and with terminals 6a, 6b, 6c, and 6d.

The surface acoustic wave device 33 further has a piezoelectric substrate 22 and a pair of spacers 23. The piezoelectric substrate 22 has a plane shape and is made of piezoelectric material such as lithium niobate, lithium tantalate, lithium borate or quartz. The piezoelectric substrate 22 is held on the holding substrate 21 with the spacers 23. The spacers 23 are formed in strips and functions as supports for holding the piezoelectric substrate 22 on the holding substrate 21 so that the interdigital transducers 4a, 4b, 4c, and 4d are evenly in contact with the piezoelectric substrate 22. The spacers 23 are bonded with the holding substrate 21 and the piezoelectric substrate 22 by direct bonding which is explained in the Example 1.

The surface acoustic wave device 33 has functions and effects similar to those of the surface acoustic wave device 31 of the Example 1. The surface acoustic wave device 33 is produced by a method similar to the method explained in the Example 1. A glass substrate having a thickness of 450 µm is used as the holding substrate 21. The piezoelectric substrate 22 is made of lithium niobate which is 64-degree Y-cut and X-propagation, and has a thickness of 450 µm. The interdigital transducers 4a, 4b, 4c, and 4d, the electrode pads 5a, 5b, 5c, and 5d, and the terminals 6a, 6b, 6c, and 6d are formed of the bilayer film of a chromium film having a thickness of about 0.01 µm and a gold film having a thickness of about 1.0 to 1.1 µm, so that the interdigital transducers 4a, 4b, 4c, and 4d are evenly in contact with the piezoelectric substrate 22. The method of bonding is also similar to that of the surface acoustic wave device 31 of the Example 1. As is mentioned in the Example 1, the thermal expansion coefficient of the holding substrate 21 is set to be lower than that of the piezoelectric substrate 22, and the width and interval of the strip lines of the interdigital transducers 4a, 4b, 4c, and 4d are set to about 0.7 µm with a plurality of input and output interdigital transducers being arranged alternately adjacent to each other, thereby to form a so-called surface acoustic wave filter having an interdigitated interdigital transducer (IIDT) structure and operating in 1.5 GHz band. Such a constitution has effects similar to the surface acoustic wave device 31 of the Example 1 with respect to the temperature dependence, insertion loss, power capacity, mechanical reliability and pyroelectricity resistance.

Similar effects of improving the temperature dependence, insertion loss, power capacity, mechanical reliability and pyroelectricity resistance can also be obtained by making a non-contact interdigital transducer structure as in this example, by using lithium tantalate, lithium borate or quartz for the piezoelectric substrate 22, using a glass substrate or silicon substrate for the holding substrate 21, and using a silicon oxide film for the spacers 23.

The silicon oxide film serving as the spacers 23 can be formed by means of ordinary thin film technology, chemical vapor deposition (CVD) or sputtering. The spacers 23 may be formed either on the holding substrate 21, piezoelectric substrate 22, or on the both substrates 21 and 22. The material for spacer is not limited to silicon oxide but may also be other films having covalent bonding property such as, for example, silicon film or silicon nitride film. Also, it is understood that the spacers 23 may be formed in different shape from the strips.

Example 4

Figure 4A:
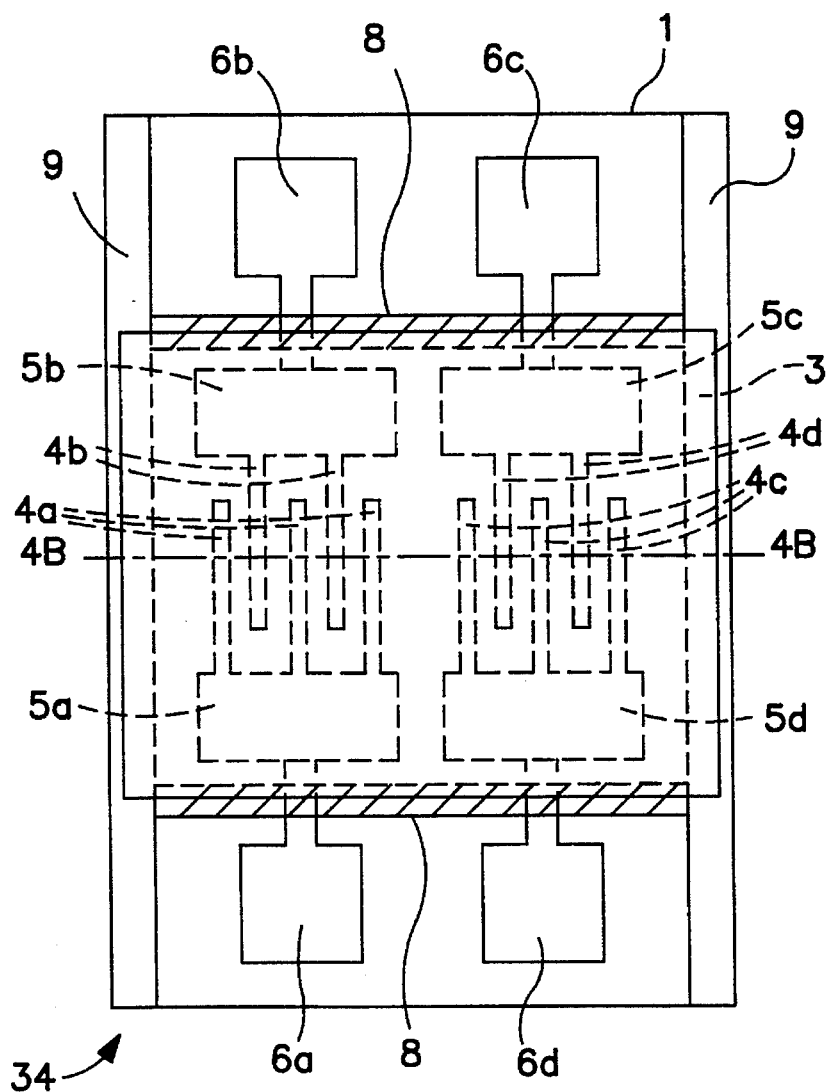
FIG. 4A is a schematic plan view of surface acoustic wave device according to Example 4 of the invention.
Figure 4B:
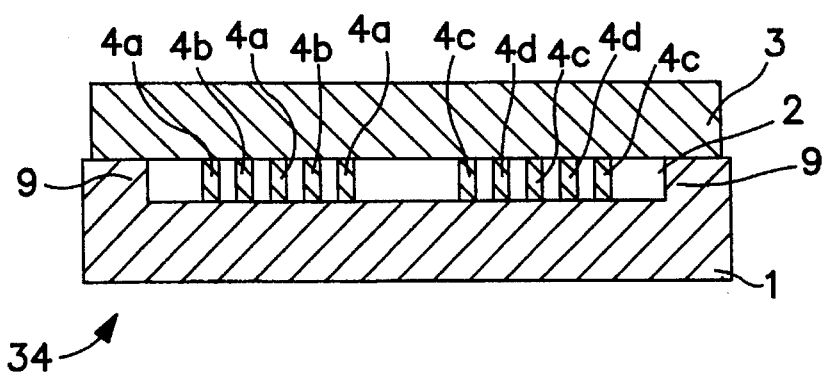
FIG. 4B is a schematic cross-sectional view of surface acoustic wave device according to Example 4 of the invention.

Hereinafter, a surface acoustic wave device of the invention according to Example 4 is now described. FIG. 4A is a schematic plan view of a surface acoustic wave device 34, and FIG. 4B is a schematic cross-sectional view taken along a line d—d' in FIG. 4A.

The surface acoustic wave device 34 is different from the surface acoustic wave device 31 of the Example 1 in that interdigital transducers 4a, 4b, 4c, and 4d are hermetically sealed. The surface acoustic wave device 34 has an adhesive 8 such as glass having a low melting point. A space defined by the recess 2 of the holding substrate 1 and the piezoelectric substrate 3 has two air gaps between the piezoelectric substrate 3 and the bottom of the recess 2 and measures about several micrometers in height and several hundred micrometers in width. The air gaps are sealed with the adhesive 8. As the piezoelectric substrate 3 is bonded to protrusions 9 of the holding substrate 1 by direct bonding which is hermetic therebetween, the space defined by the recess 2 and the piezoelectric substrate 3 is hermetic. Therefore, the surface acoustic wave oscillating section consisting of the interdigital transducers 4a, 4b, 4c, and 4d and a part of the piezoelectric substrate 3 can be hermetically sealed. It is indispensable to hermetically seal the surface acoustic wave oscillating section, because its characteristics change depending on the ambient conditions such as dew condensation, and is normally sealed in a metal or ceramic package. This construction makes it large in size, although it can also be made compact as a device while still maintaining the excellent electrical characteristics provided by the first embodiment, by making it in the constitution of this example.

EXAMPLE 5

Figure 5A:
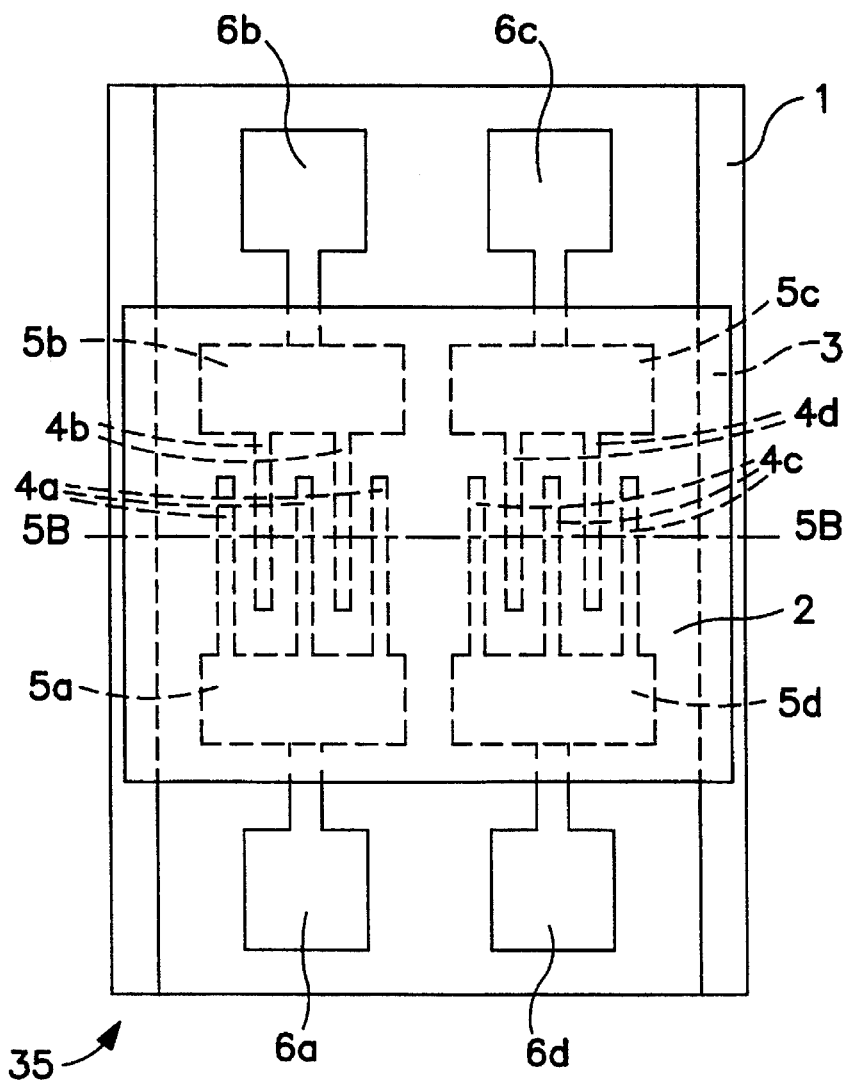
FIG. 5A is a schematic plan view of surface acoustic wave device according to Example 5 of the invention.
Figure 5B:
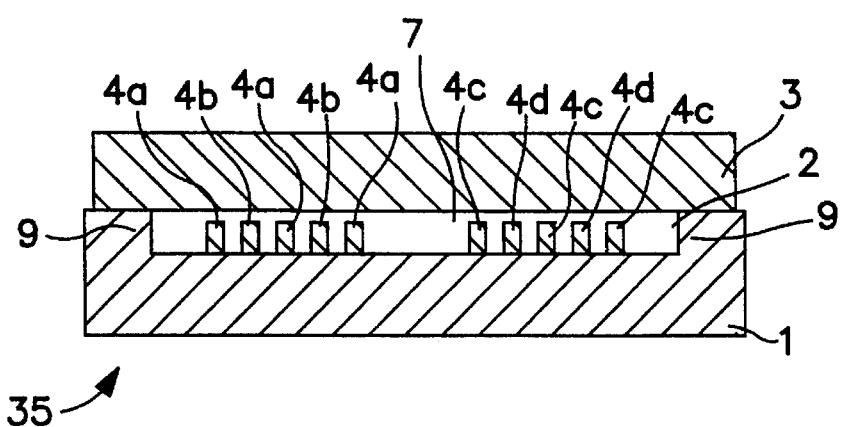
FIG. 5B is a schematic cross-sectional view of surface acoustic wave device according to Example 5 of the invention.

Hereinafter, a surface acoustic wave device of the invention according to Example 5 is now described. FIG. 5A is a schematic plan view of a surface acoustic wave device 35, and FIG. 5B is a schematic cross-sectional view taken along a line e-e' in FIG. 5A.

The surface acoustic wave device 35 is different from the surface acoustic wave device 31 of Example 1 in that there is an air gap 7 between the piezoelectric substrate 3 and interdigital transducers 4a, 4b, 4c, and 4d. Protrusions 9 formed by a recess 2 of a holding substrate 1 functions as supports for holding the piezoelectric substrate 3 above the interdigital transducers 4a, 4b, 4c, and 4d with the air gap 7 interposed therebetween.

When the air gap 7 is made narrow enough, application of an alternate electric field to the interdigital transducers 4a and 4b through the terminals 6a and 6b excites surface acoustic wave on the surface of the piezoelectric substrate 3. The excited surface acoustic wave propagates on the piezoelectric substrate 3 to reach the surface of the piezoelectric substrate which is in contact with the interdigital transducers 4c and 4d. Then, the excited surface acoustic is transformed into electric signals again by making the air gap 7 narrow enough. Therefore, the surface acoustic wave device 35 of the invention has a function similar to that of the surface acoustic wave device which has interdigital transducers formed on the piezoelectric substrate. Also, the surface acoustic wave device 35 can have less insertion loss, higher power capacity and less temperature dependence at high frequencies than that of the conventional surface acoustic wave device.

Hereinafter, a method for producing the surface acoustic wave device 35 is now explained. A glass substrate having a thickness of 450 µm is used as a holding substrate 1. The holding substrate 1 has a recess 2 which is 1 µm deep. A piezoelectric substrate 3 is made of lithium niobate which is 64-degree Y-cut and X-propagation, and has a thickness of 450 µm. After forming a resist pattern (not shown in FIGS. 5A and 5B) on a recessed portion of the holding substrate 1, a chromium film having a thickness of about 0.01 µm and a gold film having a thickness of about 0.94 µm are successively formed on the resist pattern and the recessed portion by evaporation. Then, interdigital transducers 4a, 4b, 4c, and 4d, electrode pads 5a, 5b, 5c, and 5d, and terminals 6a, 6b, 6c, and 6d are formed by a lift-off method. In this case, an air gap 7 is set to be 0.05 µm.

Bonding process is carried out after carefully cleaning the joining surfaces of the piezoelectric substrate and the holding substrate, processing the surfaces with ammonia-hydrogen peroxide solution to make the surfaces hydrophilic and cleaning them with pure water, by placing them on one another and heating them while applying pressure. This bonding is caused by hydrogen bonding of the hydrogen, oxygen and hydroxyl group which are the constituents of water absorbed onto the surface, or by covalent bonding which is caused by dehydration from the interface due to heat treatment so that stronger bonding can be obtained. Heat treatment takes effect at temperatures 100° C. and above, and therefore can be carried out at temperatures below that which causes changes in the materials constituting the substrate. In case the holding substrate 1 is made of glass, heat treatment can be applied at a temperature below the softening point of glass, and there are various glass substrates which can be heat-treated at temperatures as low as 500° C. The bonding obtained in such a process is bonding at the level of atom, and therefore an extremely strong bonding of very high surface accuracy having excellent hermetic sealing performance can be obtained. This extremely high surface accuracy enables it to control the dimension of the air gap 7 extremely uniformly and with high accuracy. Consequently stable reproduction of the electromechanical coupling factor is made possible, providing an advantage in this aspect of manufacture. Because of the extremely high mechanical strength, the air gap 7 is not affected by drop or vibration.

In case of a filter operating in 1.5 GHz band made by setting the width and interval of the strip lines of the interdigital transducers to about 0.7 μm and arranging a plurality of input and output interdigital transducers alternately adjacent to each other, to form a so-called surface acoustic wave filter having an interdigitated interdigital transducer (IIDT) structure, if the sample has the interdigital transducers being formed on the surface of a piezoelectric substrate in the conventional constitution without employing the constitution of the interdigital transducers as that of this embodiment, even when aluminum is used for the interdigital transducers to alleviate the adverse effect of the mass added to the surface acoustic wave oscillating section, it cannot be avoided to make them to a thickness about 0.06 μm, resulting in a large insertion loss due to the resistive loss of the electrodes. In this example, in contrast, insertion loss can be reduced by about 0.5 to 1.0 dB from a conventional device because Au 0.94 μm thick is used. As for the power capacity, while the surface acoustic wave device of the prior art is durable only to about 0.2 W due to the stress migration because the electrode are subject to violent vibration, the constitution non-contact interdigital transducer of this example easily achieves a power capacity of over 2 W because the interdigital transducer are not in direct contact with vibrating components. Power capacity is evaluated through the change in the central frequency when a specified level of power of high-frequency in the pass-band range is transmitted. The constitution as described above greatly improves the high-frequency loss and the power capacity.

An effect of canceling the temperature dependence of the piezoelectric substrate 3 can be obtained by selecting a glass for the holding substrate 1 having a thermal expansion coefficient lower than that of the piezoelectric substrate 3. Therefore the temperature dependence can be greatly improved by selecting an appropriate combination of the thermal expansion coefficients of the materials.

When glass having a thermal expansion coefficient about 1/5 that of the piezoelectric substrate 3 is used, for example, temperature coefficient of the surface acoustic wave device can be decreased to below half that of the conventional constitution.

Because the bonding of the holding substrate 1 and the piezoelectric substrate 3 is strong enough to withstand various vibration tests and drop test and the holding substrate 1 is thick enough, breakage of the electrode structure or change in the electrical characteristics is not found.

Also, because the interdigital transducers are formed on the holding substrate 1, it has satisfactory strength against insulation breakdown of the interdigital transducer due to pyroelectricity.

A interdigital transducer structure similar to that of this example with lithium tantalate, lithium borate or quartz used in the piezoelectric substrate and glass or silicon used in the holding substrate has substantially similar effects in terms of insertion loss, power capacity, temperature dependence, mechanical reliability and pyroelectricity resistance. Improvement in the temperature dependence similar to that described above can also be obtained by setting the thermal expansion coefficient of the holding substrate 1 lower than that of the piezoelectric substrate 3.

Example 6

Figure 6A:
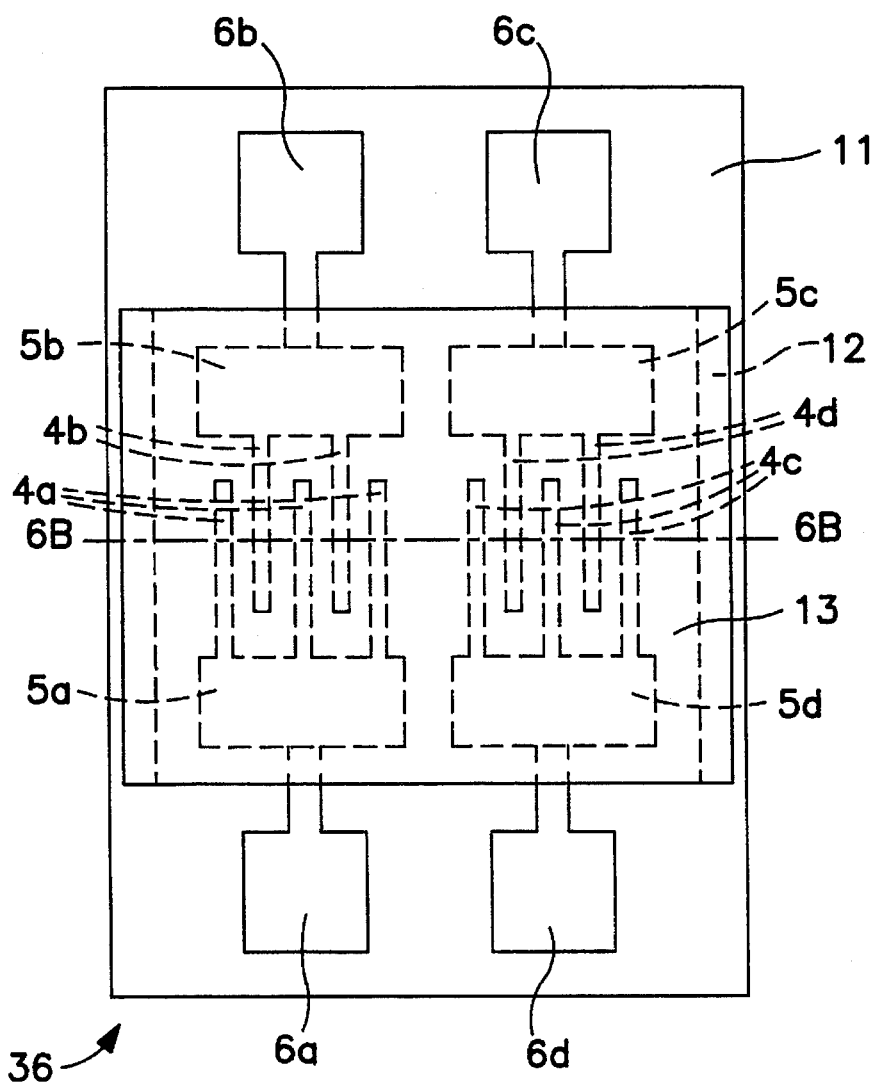
FIG. 6A is a schematic plan view of surface acoustic wave device according to Example 6 of the invention.
Figure 6B:
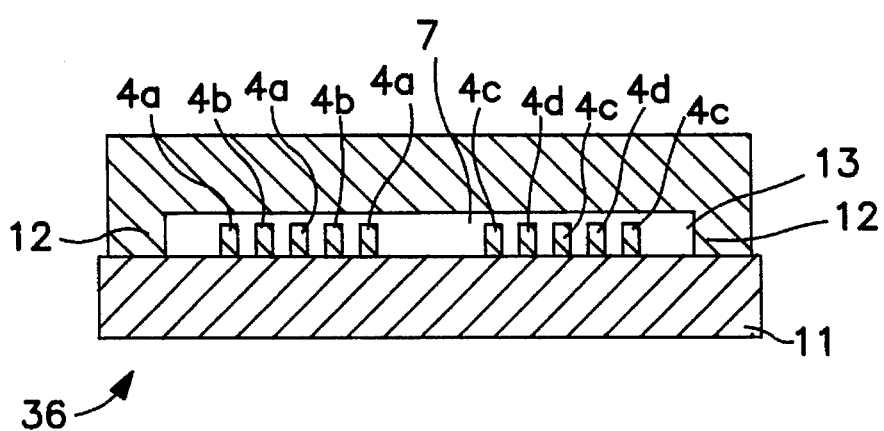
FIG. 6B is a schematic cross-sectional view of surface acoustic wave device according to Example 6 of the invention.

Hereinafter, a surface acoustic wave device of the invention according to Example 6 is now described. FIG. 6A is a schematic plan view of a surface acoustic wave device 36, and FIG. 6B is a schematic cross-sectional view taken along a line e-e' in FIG. 6A.

The surface acoustic wave device 36 is different from the surface acoustic wave device 32 of Example 2 in that there is an air gap 7 between the piezoelectric substrate 12 and interdigital transducers 4a, 4b, 4c, and 4d. Protrusions 14 formed by a recess 13 of the piezoelectric substrate 12 functions as supports for holding the piezoelectric substrate 13 above the interdigital transducers 4a, 4b, 4c, and 4d with the air gap 7 interposed therebetween.

The surface acoustic wave device 36 has functions and effects similar to those of the surface acoustic wave device 35 of the Example 5. The surface acoustic wave device 36 is produced by a method similar to the method explained in the Example 2. A glass substrate having a thickness of 450 μm is used as the holding substrate 11. The piezoelectric substrate 12 is made of lithium niobate which is 64-degree Y-cut and X-propagation, and has a thickness of 450 μm. The piezoelectric substrate 12 also has the recess 13 which is 1 μm deep. The interdigital transducers 4a, 4b, 4c, and 4d, the electrode pads 5a, 5b, 5c, and 5d, and the terminals 6a, 6b, 6c, and 6d are formed of the bilayer film of a chromium film having a thickness of about 0.01 μm and a gold film having a thickness of about 0.94 μm. In this case, the air gap 7 is set to be about 0.05 μm.

Also similar to the surface acoustic wave device 35 of the Example 5, when a filter operating in 1.5 GHz band is made by setting the width and interval of the strip lines of the interdigital transducers to about 0.7 μm and arranging a plurality of input and output interdigital transducers alternately adjacent to each other in order to form a so-called surface acoustic wave filter having an interdigitated interdigital transducer (IIDT) structure, satisfactory results similar to those of the fifth embodiment can be obtained in terms of insertion loss, power capacity, mechanical reliability and pyroelectricity resistance. Similar effects of improving the temperature characteristic similar to the surface acoustic wave device 35 of the Example 5 can also be obtained by setting the thermal expansion coefficient of the holding substrate 11 lower than that of the piezoelectric substrate 12.

A interdigital transducer structure similar to that of this example with lithium tantalate, lithium borate or quartz being used for the piezoelectric substrate 12, and glass or silicon being used for the holding substrate 11 has substantially similar effects in terms of insertion loss, power capacity, mechanical reliability and pyroelectricity resistance. Improvement in the temperature characteristic similar to that described above can also be obtained by setting the thermal expansion coefficient of the holding substrate 11 lower than that of the piezoelectric substrate 12.

Example 7

Figure 7A:
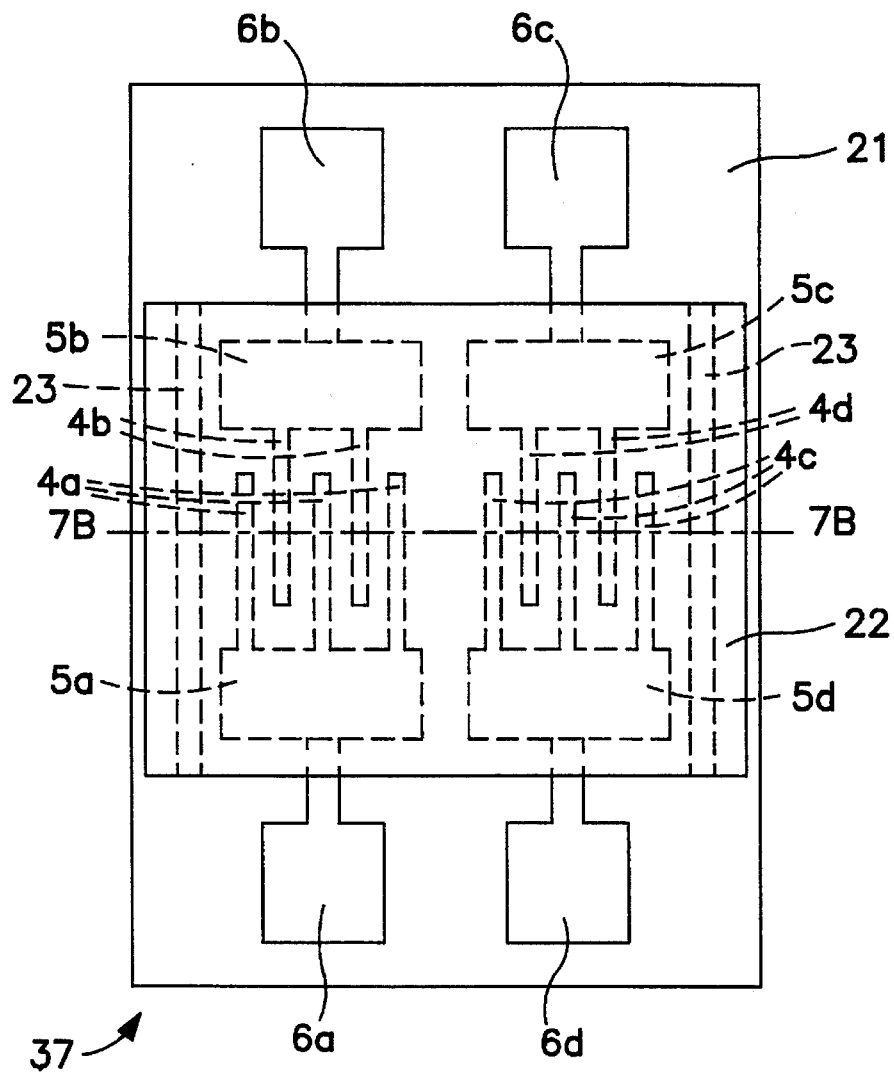
FIG. 7A is a schematic plan view of surface acoustic wave device according to Example 7 of the invention.
Figure 7B:
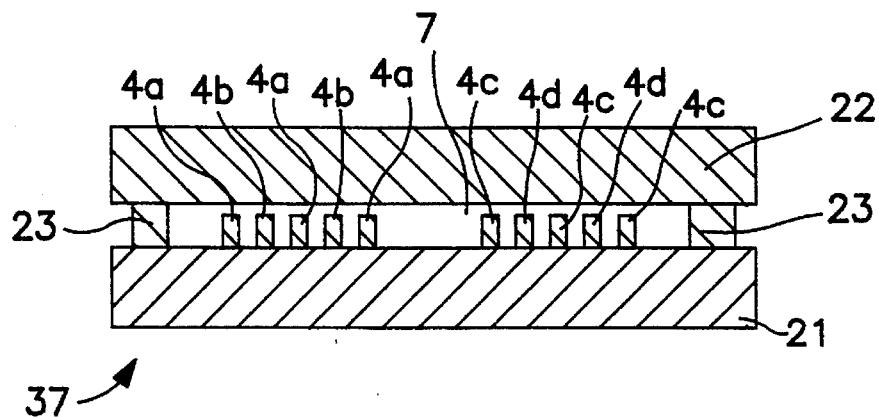
FIG. 7B is a schematic cross-sectional view of surface acoustic wave device according to Example 7 of the invention.

Hereinafter, a surface acoustic wave device of the invention according to Example 7 is now described. FIG. 7A is a schematic plan view of a surface acoustic wave device 37, and FIG. 7B is a schematic cross-sectional view taken along a line g-g' in FIG. 7A.

The surface acoustic wave device 37 is different from the surface acoustic wave device 33 of the Example 3 in that there is an air gap 7 between the piezoelectric substrate 22 and interdigital transducers 4a, 4b, 4c, and 4d. Spacers 23 functions as supports for holding the piezoelectric substrate 22 above the interdigital transducers 4a, 4b, 4c, and 4d with the air gap 7 interposed therebetween.

The surface acoustic wave device 37 has functions and effects similar to those of the surface acoustic wave device 35 of the Example 5. The surface acoustic wave device 37 is produced by a method similar to the method explained in the Example 3. A glass substrate having a thickness of 450 μm is used as the holding substrate 21. The spacers 23 having a height of about 1 μm are formed on the holding substrate 21. The piezoelectric substrate 22 is made of lithium niobate which is 64-degree Y-cut and X-propagation, and has a thickness of 450 μm. The interdigital transducers 4a, 4b, 4c, and 4d, the electrode pads 5a, 5b, 5c, and 5d, and the terminals 6a, 6b, 6c, and 6d are formed of the bilayer film of a chromium film having a thickness of about 0.01 μm and a gold film having a thickness of about 0.94 μm. In this case, the air gap 7 is set to be about 0.05 μm. Bonding process is carried out in substantially similar process to the Example 3.

Also similar to the surface acoustic wave device 35 of the Example 5, when width and interval of the strip lines of the interdigital transducers are set to be about 0.7 μm with a plurality of input and output interdigital transducers being arranged alternately adjacent to each other, thereby to form a so-called surface acoustic wave filter having an interdigitated interdigital transducer (IIDT) structure and operating in 1.5 GHz band, satisfactory results similar to those of the surface acoustic wave device 35 can be obtained with respect to the insertion loss, power capacity, temperature characteristic, mechanical reliability and pyroelectricity resistance.

Similar effects of improving the insertion loss, power capacity, mechanical reliability and pyroelectricity resistance can also be obtained by making a interdigital transducer structure as in this example, by using lithium tantalate, lithium borate or quartz for the piezoelectric substrate 22, using a glass substrate or silicon substrate for the holding substrate 21, and using a silicon oxide film for the spacer. Improvement in the temperature characteristic similar to that described above can also be obtained by setting the thermal expansion coefficient of the holding substrate 21 lower than that of the piezoelectric substrate 22.

Example 8

Figure 8A:
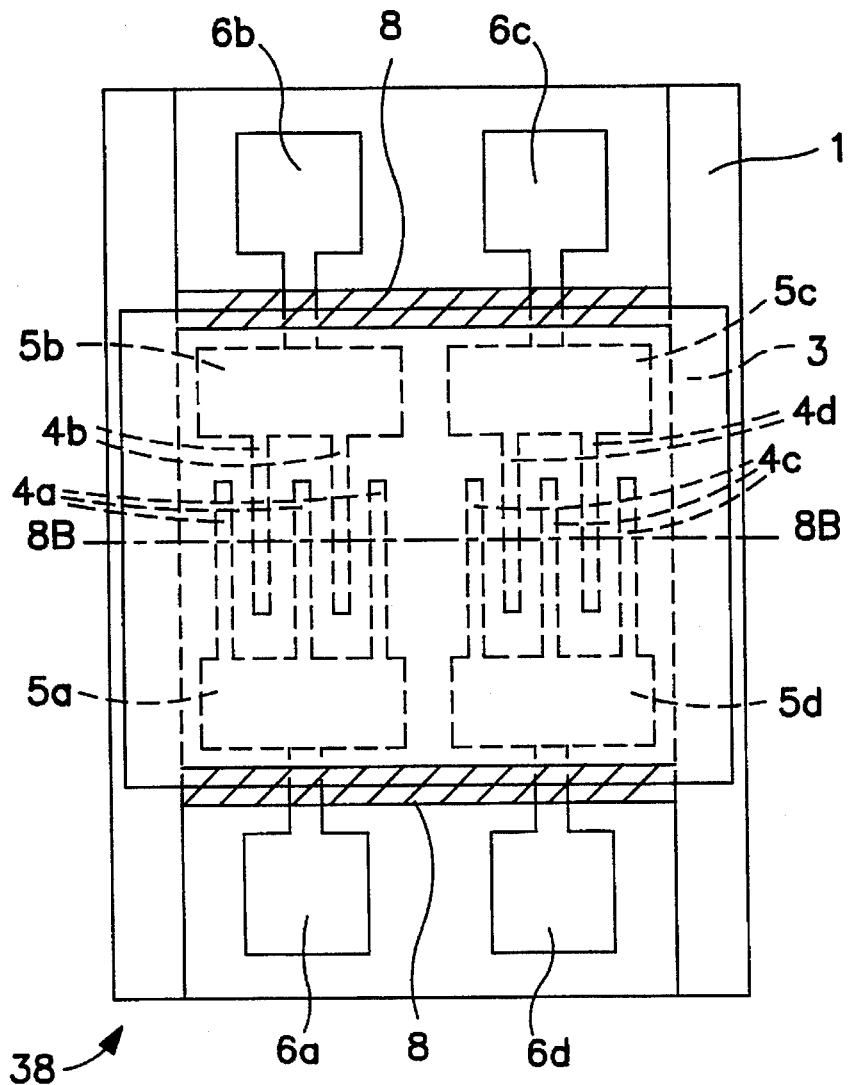
FIG. 8A is a schematic plan view of surface acoustic wave device according to Example 8 of the invention.
Figure 8B:
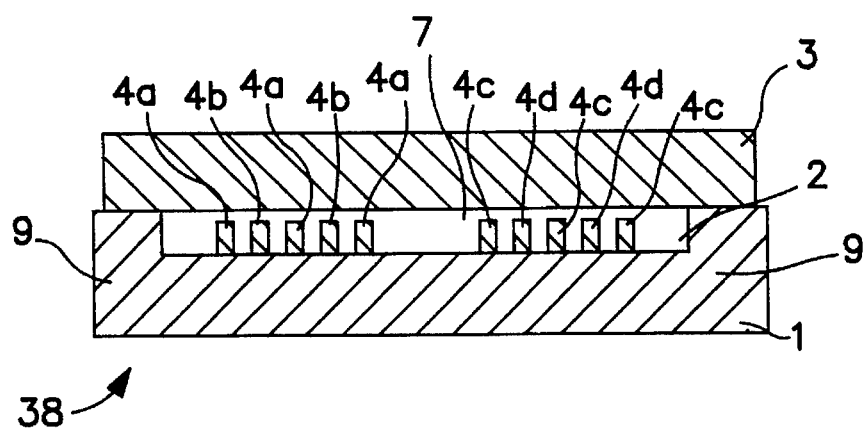
FIG. 8B is a schematic cross-sectional view of surface acoustic wave device according to Example 8 of the invention.

Hereinafter, a surface acoustic wave device of the invention according to Example 8 is now described. FIG. 8A is a schematic plan view of a surface acoustic wave device 38, and FIG. 8B is a schematic cross-sectional view taken along a line h-h' in FIG. 8A.

The surface acoustic wave device 38 is different from the surface acoustic wave device 34 of Example 8 in that there is an air gap 7 between the piezoelectric substrate 3 and interdigital transducers 4a, 4b, 4c, and 4d. Protrusions 9 formed by a recess 2 of a holding substrate 1 functions as supports for holding the piezoelectric substrate 3 above the interdigital transducers 4a, 4b, 4c, and 4d with the air gap 7 interposed therebetween.

It is indispensable to hermetically seal the surface acoustic wave oscillating section, because its characteristics change depending on the ambient conditions such as dew condensation, and is normally sealed in a metal or ceramic package. This construction makes it large in size, though it can be made compact as a device while maintaining the excellent electrical characteristics obtained in the surface acoustic wave device 35 of the Example 5, by making it in the constitution of this example.

Example 9

Figure 9A:
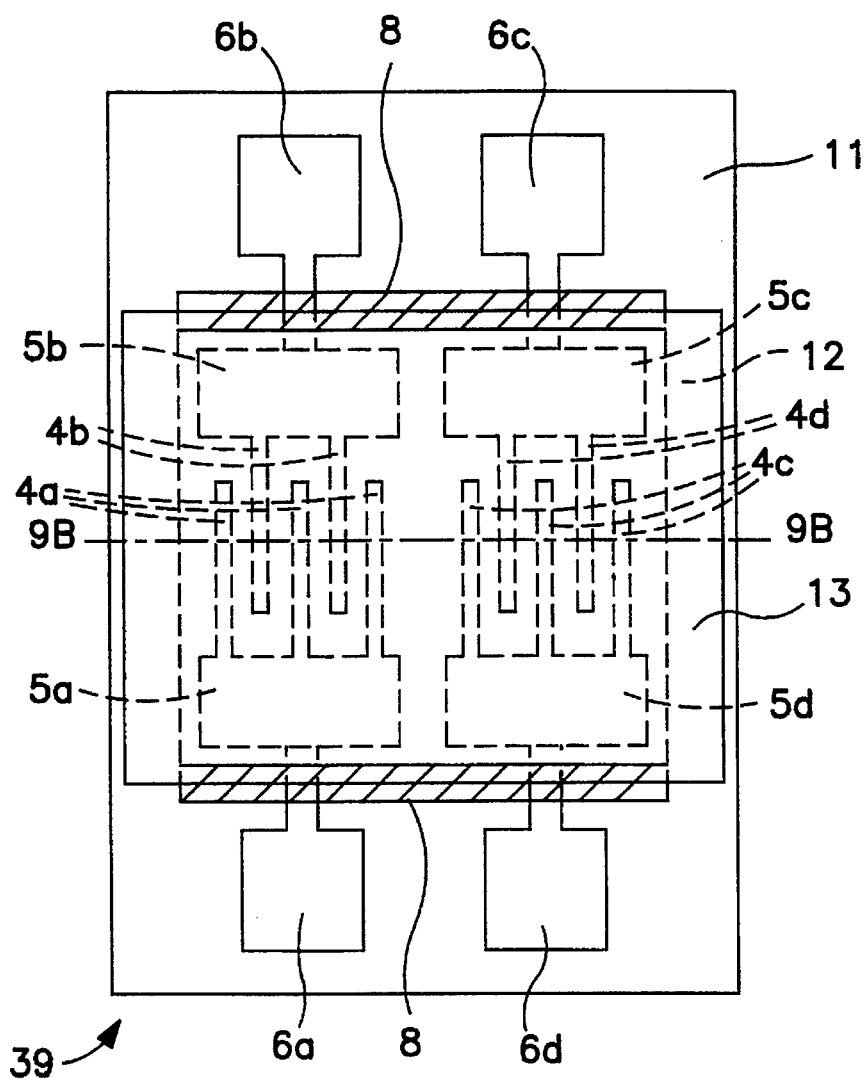
FIG. 9A is a schematic plan view of surface acoustic wave device according to Example 9 of the invention.
Figure 9B:
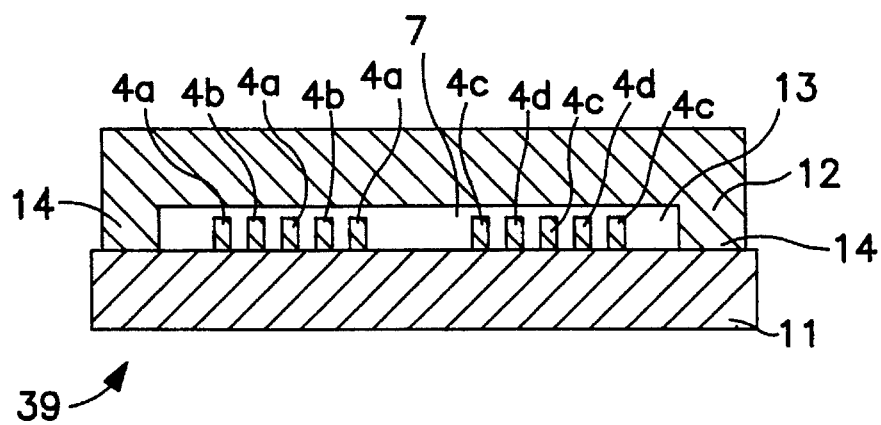
FIG. 9B is a schematic cross-sectional view of surface acoustic wave device according to Example 9 of the invention.

Hereinafter, a surface acoustic wave device of the invention according to Example 9 is now described. FIG. 9A is a schematic plan view of a surface acoustic wave device 39, and FIG. 9B is a schematic cross-sectional view taken along a line i-i' in FIG. 9A.

The surface acoustic wave device 39 is different from the surface acoustic wave device 32 of Example 2 in that there is an air gap 7 between the piezoelectric substrate 12 and interdigital transducers 4a, 4b, 4c, and 4d and in that the interdigital transducers 4a, 4b, 4c, and 4d are hermetically sealed.

The surface acoustic wave device 39 has an adhesive 8 such as glass having a low melting point for this purpose. A space defined by a recess 13 of the holding substrate 11 and the piezoelectric substrate 12 has two air gaps between the piezoelectric substrate 12 and the bottom of the recess 13 and measures about several micrometers in height and several hundred micrometers in width. The air gaps are sealed with the adhesive 8. As the piezoelectric substrate 12 is bonded to the protrusions 14 of the holding substrate 11 by direct bonding which is hermetic therebetween, the space defined by the recess and the piezoelectric substrate 12 is hermetic. Therefore, the surface acoustic wave oscillating section consisting of the interdigital transducers 4a, 4b, 4c, and 4d and a part of the piezoelectric substrate 12 can be hermetically sealed. It is indispensable to hermetically seal the surface acoustic wave oscillating section, because its characteristics change depending on the ambient conditions such as dew condensation, and is normally sealed in a metal or ceramic package. This construction makes it large in size, though it can be made compact as a device while maintaining the excellent electrical characteristics provided by the Example 1, by making it as in the constitution of this example.

Moreover, the protrusions 14 formed by a recess 13 of the piezoelectric substrate 12 functions as supports for holding the piezoelectric substrate 12 above the interdigital transducers 4a, 4b, 4c, and 4d with the air gap 7 interposed therebetween. When the air gap 7 is made narrow enough, application of alternate electric field to the interdigital transducers 4a and 4b through the terminals 6a and 6b excites the surface acoustic wave on the surface of the piezoelectric substrate 12. The excited surface acoustic wave propagates on the piezoelectric substrate 12 to reach the surface of the piezoelectric substrate 12 which is in contact with the interdigital transducers 4c and 4d. Then, the excited surface acoustic is transformed into electric signals again by making the air gap 7 narrow enough. Therefore, the surface acoustic wave device 35 of this invention has a function similar to that of the surface acoustic wave device which has interdigital transducers formed on the piezoelectric substrate. Also, the surface acoustic wave device 35 can have less insertion loss, higher power capacity and less temperature dependence at high frequencies than that of the conventional surface acoustic wave device.

In the Examples 5 to 9, the width of the air gap 7 can be freely varied in a range from about 0.005 μm to several micrometers by controlling the thickness of the interdigital transducers 4a, 4b, 4c, and 4d and the depth of the recess 2 or 13 or the height of the spacers 23. Although the air gap is desirably kept as small as possible for the reason of electric field intensity, it is interrelated with the electrode size and the air gap 7 may be to a certain degree large if the electrode size is not so small.

In the Examples 1 to 9, heat treatment shows a remarkable effect at temperatures over 250° C. and the bonding strength increases as the temperature becomes higher. Therefore the heat treatment is preferably applied at a higher temperature to the extent that the holding substrate and the piezoelectric substrate do not change their characteristics due to the heat.

In the Examples 1 to 9, the holding substrate and the piezoelectric substrate made in any of the combinations of materials described above can be bonded by processing to make the surfaces hydrophilic and applying heat treatment to the substrate placed on one another. Because the holding substrate and the piezoelectric substrate can be bonded directly as described above, degree of pressure bonding between the piezoelectric substrate and the interdigital transducers and the dimension of the air gap can be made with extremely high accuracy and uniform in a certain area. This bond is also extremely stable at temperatures below the heat treatment temperature for the bonding process, and has a high hermetic sealing performance. Thus bond made by heat treatment at 250° C. or higher temperature is extremely stable in the normal operating temperatures, from −30° C. to 70° C.

Although the bilayer film of chromium and gold, with a typical thickness of 0.01 μm and 0.94 to 1.1 μm, respectively, are used for the interdigital transducers 4a, 4b, 4c, and 4d, the electrode pads 5a, 5b, 5c, and 5d, and the terminals 6a, 6b, 6c, and 6d in the above examples, the bilayer film can be made similarly by using ordinary metals such as titanium, platinum, silver, copper, aluminum, tungsten and nickel, with various thicknesses.

Although a constitution of the so-called transversal surface acoustic wave filter is described for the surface acoustic wave device in the above examples, the invention can be applied to other structures such as an interdigitated interdigital transducer (IIDT) structure type and a resonator type as well which are used at high frequencies by using interdigital transducers with similar effects.

In the surface acoustic wave devices described in the Examples 1 to 4, because there is no air gap between the interdigital transducer and the piezoelectric substrate, surface acoustic wave devices having greater electromechanical coupling factors and accordingly less loss can be obtained than those of the Examples 5 to 9 wherein air gaps are provided. Because there is no need for controlling the air gap during manufacture, there are advantages of better reproduction and yield in the manufacture.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A surface acoustic wave device comprising:

a holding substrate;

a piezoelectric substrate;

an interdigital transducer formed on said holding substrate; and means, provided between said holding substrate and said piezoelectric substrate, for holding said piezoelectric substrate on said interdigital transducer so that said interdigital transducer is evenly in contact with said piezoelectric substrate and excites a surface acoustic wave on a surface of said piezoelectric substrate, wherein said holding means is bonded with one of said holding substrate and said piezoelectric substrate through at least one of covalent bonding with oxygen atoms and hydrogen bonding with hydroxyl groups by direct bonding.

2. A surface acoustic wave device according to claim 1, wherein said holding substrate has a recess and protrusions formed by said recess, said interdigital transducer is formed on a recessed position of said holding substrate, and said holding means includes said protrusions of said holding substrate.

3. A surface acoustic wave device according to claim 1, wherein said piezoelectric substrate has a recess and protrusions formed by said recess, said interdigital transducer is in contact with a recessed position of said piezoelectric substrate, and said holding means includes said protrusions of said piezoelectric substrate.

4. A surface acoustic wave device according to claim 1, wherein said holding means includes at least one spacer.

5. A surface acoustic wave device according to claim 1, wherein the thermal expansion coefficients of said holding substrate is smaller than the thermal expansion coefficient of said piezoelectric substrate, and said piezoelectric substrate is made of a material selected from the group consisting of lithium niobate, lithium tantalate, lithium borate and quartz.

6. A surface acoustic wave device according to claim 1, wherein said piezoelectric substrate is made of a material selected from the group consisting of lithium niobate, lithium tantalate, lithium borate and quartz.

7. A surface acoustic wave device according to claim 1, wherein said holding substrate is made of one of glass and silicon.

8. A surface acoustic wave device according to claim 1, wherein an air gap formed by said holding substrate and said piezoelectric substrate is sealed by a hermetic sealing adhesive, thereby hermetically sealing at least said interdigital transducer.

9. A surface acoustic wave device comprising:

a holding substrate;

a piezoelectric substrate;

an interdigital transducer formed on said holding substrate; and means, provided between said holding substrate and said piezoelectric substrate for holding said piezoelectric substrate above said interdigital transducer with an air gap interposed therebetween so that said interdigital transducer excites a surface acoustic wave on a surface of said piezoelectric substrate, wherein said holding means is bonded with one of said holding substrate and said piezoelectric substrate through at least one of covalent bonding with oxygen atoms and hydrogen bonding with hydroxyl groups by direct bonding.

10. A surface acoustic wave device according to claim 9, wherein said holding substrate has a recess and protrusions formed by said recess, said interdigital transducer is formed on a recessed position of said holding substrate, and said holding means includes said protrusions of said holding substrate.

11. A surface acoustic wave device according to claim 9, wherein said piezoelectric substrate has a recess and protrusions formed by said recess, and said holding means includes said protrusions of said piezoelectric substrate.

12. A surface acoustic wave device according to claim 9, wherein said holding means includes at least one spacer.

13. A surface acoustic wave device according to claim 9, wherein the thermal expansion coefficients of said holding substrate is smaller than the thermal expansion coefficient of said piezoelectric substrate, and said piezoelectric substrate is made of a material selected from the group consisting of lithium niobate, lithium tantalate, lithium borate and quartz.

14. A surface acoustic wave device according to claim 9, wherein said piezoelectric substrate is made of a material selected from the group consisting of lithium niobate, lithium tantalate, lithium borate and quartz.

15. A surface acoustic wave device according to claim 9, wherein said holding substrate is made of one of glass and silicon.

16. A surface acoustic wave device according to claim 9, wherein an air gap formed by said holding substrate and said piezoelectric substrate is sealed by a hermetic sealing adhesive thereby hermetically sealing said interdigital transducer.

* * * * *